United States Patent [19]

Uetani et al.

[11] Patent Number: 5,395,727
[45] Date of Patent: Mar. 7, 1995

[54] POSITIVE RESIST COMPOSITION CONTAINING A NOVOLAK RESIN MADE FROM AN ALDEHYDE AND DIMER OF ISOPROPENYL PHENOL

[75] Inventors: Yasunori Uetani; Haruyoshi Osaki; Naoki Takeyama; Yuji Ueda; Hiromi Ueki, all of Osaka; Takehiro Kusumoto, Hyogo, all of Japan

[73] Assignee: Sumitomo Chemical Company, Limited, Osaka, Japan

[21] Appl. No.: 158,817

[22] Filed: Nov. 29, 1993

Related U.S. Application Data

[63] Continuation of Ser. No. 879,270, May 7, 1992, abandoned, which is a continuation-in-part of Ser. No. 696,193, May 6, 1991, abandoned.

[30] Foreign Application Priority Data

Jun. 5, 1990 [JP] Japan .................................. 2-147737
Sep. 27, 1991 [JP] Japan .................................. 3-249071

[51] Int. Cl.$^6$ ......................... G03F 7/023; G03F 7/30
[52] U.S. Cl. .................................. 430/192; 430/165; 430/193; 528/153; 528/155
[58] Field of Search ................... 430/192, 193, 165; 528/153, 155

[56] References Cited

U.S. PATENT DOCUMENTS

| | | | |
|---|---|---|---|
| 4,102,686 | 7/1978 | Weinberger et al. | 430/192 |
| 4,179,429 | 12/1979 | Hanauye et al. | 528/153 |
| 4,232,134 | 11/1980 | Schmidt et al. | 528/129 |
| 4,241,201 | 12/1980 | Annis | 528/153 |
| 4,268,648 | 5/1981 | Freitag et al. | 528/153 |
| 4,871,646 | 10/1989 | Hayase et al. | 430/192 |
| 5,112,719 | 5/1992 | Yamada et al. | 430/191 |

FOREIGN PATENT DOCUMENTS 711626 10/1951 United Kingdom .

OTHER PUBLICATIONS

W. S. DeForest, "Photoresist Materials & Processes", McGraw-Hill Book Co., pp. 54–62 (1975).
Journal of Japan Printing Society, vol. 28, No. 5.

Primary Examiner—Charles L. Bowers, Jr.
Assistant Examiner—John S. Chu
Attorney, Agent, or Firm—Birch, Stewart, Kolasch & Birch

[57] ABSTRACT

A novolak resin made from a carbonyl compound and a specific phenol compound, which resin has good properties, in particular, as a base resin of a photoresist.

10 Claims, 1 Drawing Sheet

POSITIVE RESIST COMPOSITION CONTAINING A NOVOLAK RESIN MADE FROM AN ALDEHYDE AND DIMER OF ISOPROPENYL PHENOL

This application is a continuation of application Ser. No. 07/879,270, filed May 7, 1992, now abandoned, which is a continuation-in-part application of Ser. No. 07/696,193, filed on May 6, 1991, now abandoned.

BACKGROUND OF THE INVENTION

1. Field of the Invention

The present invention relates to a novel novolak thermosetting resin, in particular, a novolak resin to be used in a photoresist, a process for the preparation of said novolak resin and a positive resist composition which comprises said novolak resin and is excellent in sensitivity, heat resistance and film thickness retention.

2. Description of the Related Art

Since a phenol resin which is prepared by a reaction between a phenol compound and a carbonyl compound is excellent in heat resistance, it is used as a thermosetting resin in a wide variety of industrial fields such as a woodworking industry and an electric industry. In particular, in recent years, it is used as a pattern-forming material (resist) in the formation of minute patterns of an integrated circuit in a semiconductor field.

For example, a resist comprising a novolak resin which is prepared by an addition condensation of an aldehyde with at least one of m-cresol and p-cresol is generally used in the pattern formation using the i-line or the g-line as a light source, but its heat resistance is still unsatisfactory. Further, the resist comprising the above novolak resin is not necessarily satisfactory as a pattern-forming material for 64M DRAM in the next generation and 256M DRAM in the next but one generation. In particular, for the use of an excimer laser lithography which uses an excimer laser as a light source, its transparency is insufficient, and a submicron order pattern has not been formed.

A radiation-sensitive resist composition containing a compound having a quinone diazide group finds use as a positive resist, because upon exposure to light having a wavelength of not longer than 500 nm, the quinone diazide group decomposes to form a carboxyl group whereby the originally alkali-insoluble composition becomes alkali-soluble. The positive resist composition has much better resolution than a negative resist composition and is used in the production of integrated circuits such as IC or LSI.

Recently, particularly in the production of integrated circuits, miniaturization has proceeded as the integration level has increased, which results in demands for formation of patterns of submicron order. According to conventional processes for the production of integrated circuits, light exposure is accomplished by placing a mask in intimate contact to a substrate, e.g. a silicon wafer. It is said that this process cannot make patterns thinner than 2 μm. Instead of such conventional processes, the reduction projection in exposure system attracts attention. According to this new system, a pattern of a master mask (reticle) is projected on the substrate with reduction by a lens system, whereby exposure is accomplished. This system realizes a resolving power of submicron.

One of the serious problems in this system is low throughput. Namely, in this system, the total exposure time to expose a wafer is very long because of divided and repeated light exposure unlike a batch light exposure system which is employed in the conventional mask contact printing methods.

To solve this problem, not only an improvement in the apparatus but also an increase in sensitivity of the resist to be used are important.

To increase the sensitivity, a molecular weight of an alkali-soluble resin is decreased. However, the decrease of the alkali-soluble resin molecular weight deteriorates heat resistance.

One of other measures to increase the sensitivity of the resist is selection of a monomer which is added to the alkali-soluble resin so as to increase a dissolving rate of the resin in an alkaline developing solution. For example, in case of a novolak resin, when a ratio of a monomer which is highly soluble in the alkali developing solution such as m-cresol or phenol, the dissolving rate of the resin in the developing solution can be increased.

By the above measure, though the sensitivity of the photoresist is increased without deterioration of heat resistance and also without decreasing the molecular weight of the alkali-soluble resin, film thickness retention is deteriorated, which results in decrease of resolution.

In general, it is impossible to improve the sensitivity with maintaining heat resistance and the film thickness retention, and vice versa.

SUMMARY OF THE INVENTION

An object of the present invention is to provide a novel novolak resin which has good heat resistance and transparency (light transmittance) as a photoresist material.

Another object of the present invention is to provide a positive resist composition which has better heat resistance without deterioration of sensitivity and film thickness retention.

The present invention is based on the finding that, when a novolak resin prepared by a condensation reaction of a carbonyl compound with a compound of the following general formula (VII) is used as an alkali-soluble resin in a positive resist composition, the heat resistance can be much improved without deterioration of sensitivity and film thickness retention.

According to a first aspect of the present invention, there is provided a novolak resin having an average molecular weight of 2000 to 50,000 and comprising at least one kind of a repeating unit selected from the group of the following repeating units (I), (II) and (III):

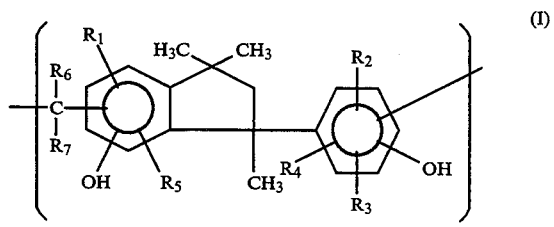

wherein $R_1$ to $R_5$ are independently a hydrogen atom, a substituted or unsubstituted and straight or branched alkyl group, a substituted or unsubstituted and straight or branched alkenyl group, an acetyl group or a halogen atom, and $R_6$ and $R_7$ are independently a hydrogen atom, a substituted or unsubstituted alkyl group, a benzyl group or a phenyl group, provided that the group:

is present at an o-position or a p-position to the —OH group;

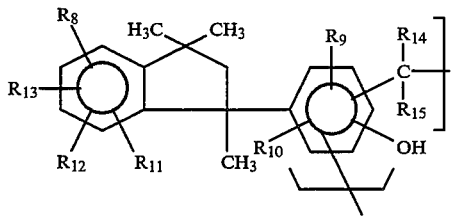

(II)

wherein $R_8$ to $R_{13}$ are independently a hydrogen atom, a substituted or unsubstituted and straight or branched alkyl group, a substituted or unsubstituted and straight or branched alkenyl group, an acetyl group or a halogen atom, and $R_{14}$ and $R_{15}$ are independently a hydrogen atom, a substituted or unsubstituted alkyl group, a benzyl group or a phenyl group, provided that the group:

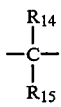

is present at an o-position or a p-position to the —OH group;

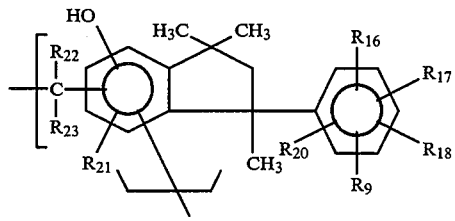

(III)

wherein $R_{16}$ to $R_{21}$ are independently a hydrogen atom, a substituted or unsubstituted and straight or branched alkyl group, a substituted or unsubstituted and straight or branched alkenyl group, an acetyl group or a halogen atom, and $R_{22}$ and $R_{23}$ are independently a hydrogen atom, a substituted or unsubstituted alkyl group, a benzyl group or a phenyl group, provided that the group:

is present at an o-position or a p-position to the —OH group.

According to a second aspect of the present invention, there is provided a process for preparing the above novolak resin which comprises at least one kind of repeating unit selected from the group consisting of the repeating units (I), (II) and (III) comprising addition condensating a phenol which comprises a compound of the formula (IV) with a carbonyl compound in the presence of an acid catalyst:

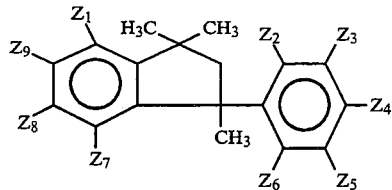

(IV)

wherein $Z_1$ to $Z_9$ are independently a hydrogen atom, a substituted or unsubstituted and straight or branched alkyl group, a substituted or unsubstituted and straight or branched alkenyl group, an acetyl group, a halogen atom or a hydroxyl group, at least one of $Z_1$, $Z_7$, $Z_8$ and $Z_9$ is a hydroxyl group and, at an o-position or a p-position to this hydroxyl group, at least one hydrogen atom is present and that one of $Z_2$ to $Z_6$ is a hydroxyl group and, at an o-position or a p-position to this hydroxyl group, at least one hydrogen atom is present.

According to a third aspect of the present invention, there is provided a process for preparing the above novolak resin which comprises the repeating unit (II) comprising addition condensating a phenol which comprises a compound of the formula (V) with a carbonyl compound in the presence of an acid catalyst:

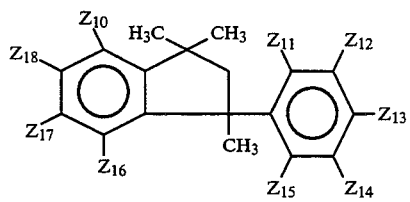

(V)

wherein $Z_{10}$ to $Z_{18}$ are independently a hydrogen atom, a substituted or unsubstituted and straight or branched alkyl group, a substituted or unsubstituted and straight or branched alkenyl group, an acetyl group, a halogen atom or a hydroxyl group, one of $Z_{11}$ to $Z_{15}$ is a hydroxyl group and, at an o-position or a p-position to this hydroxyl group, at least two hydrogen atoms are present and that any of $Z_{10}$, $Z_{16}$, $Z_{17}$ and $Z_{18}$ is not a hydroxyl group.

According to a fourth aspect of the present invention, there is provided a process for preparing the above novolak resin which comprises the repeating unit (III) comprising addition condensating a phenol which comprises a compound of the formula (VI) with a carbonyl compound in the presence of an acid catalyst:

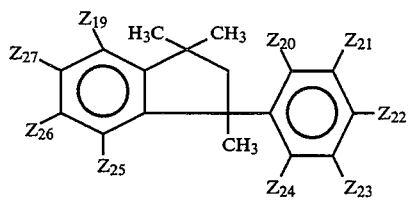

(VI)

wherein $Z_{19}$ to $Z_{27}$ are independently a hydrogen atom, a substituted or unsubstituted and straight or branched alkyl group, a substituted or unsubstituted and straight or branched alkenyl group, an acetyl group, a halogen atom or a hydroxyl group, one of $Z_{19}$, $Z_{25}$, $Z_{26}$ and $Z_{27}$ is a hydroxyl group and, at an o-position or a p-position to this hydroxyl group, at least two hydrogen atoms are present and that any of $Z_{20}$ to $Z_{24}$ is not a hydroxyl group.

According to a fifth aspect of the present invention, there is provided a positive resist composition comprising a radiation-sensitive compound and an alkali-soluble resin which is obtainable by a condensation reaction of a carbonyl compound and a compound of the formula:

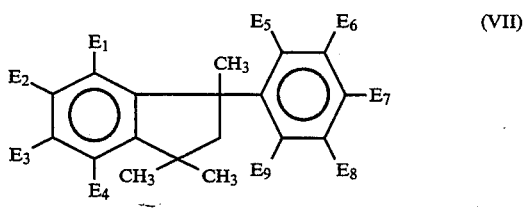

(VII)

wherein $E_1$ to $E_9$ are the same or different and independently a hydrogen atom, an alkyl group, a halogen atom or a hydroxyl group, provided that at least one of $E_1$ to $E_9$ is a hydroxyl group and that at least two of $E_1$ $E_9$ at the ortho- and para-positions to said at least one hydroxyl group are hydrogen atoms.

BRIEF DESCRIPTION OF THE DRAWING

FIGURE is an NMR chart of the novolak resin prepared in Example 2.

DETAILED DESCRIPTION OF THE INVENTION

Figure 1:
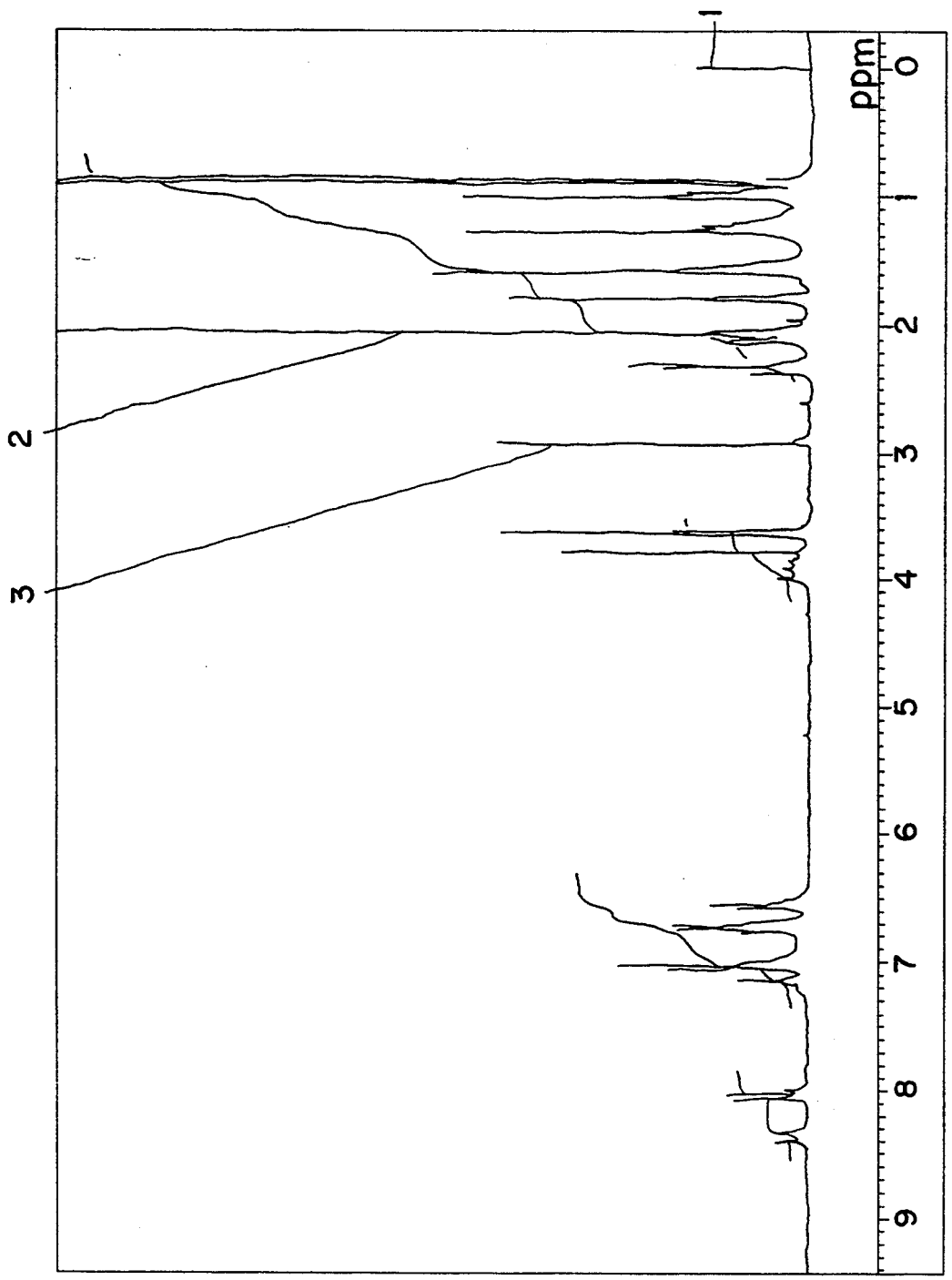

When the compound (IV) is addition condensated with the carbonyl compound, the novolak resin comprising at least one kind of repeating unit selected from the repeating units (I), (II) and (III) is obtained.

When the compound (V) is addition condensated with the carbonyl compound, the novolak resin comprising the repeating unit (II) is obtained.

When the compound (VI) is addition condensated with the carbonyl compound, the novolak resin comprising the repeating unit (III) is obtained.

As the alkyl group for $R_1$ to $R_{23}$ and $Z_1$ to $Z_{27}$, an alkyl group having 1 to 5 carbon atoms is preferred. As the alkenyl group for $R_1$ to $R_5$, $R_8$ to $R_{13}$, $R_{16}$ to $R_{21}$ and $Z_1$ to $Z_{27}$, an alkenyl group having 2 to 5 carbon atoms is preferred.

As the halogen atom, a fluorine atom, a chlorine atom, a bromine atom and an iodine atom are exemplified.

Examples of a substituent for the alkyl group and the alkenyl group are a halogen atom (e.g. a fluorine atom, a chlorine atom, a bromine atom and an iodine atom), a hydroxyl group, a mercapto (—SH) group, a lower alkylthio group and a phenyl group.

As $R_1$ to $R_{23}$ and $Z_1$ to $Z_{27}$, a hydrogen atom or a substituted or unsubstituted $C_1$-$C_5$ alkyl group (e.g. a methyl group, an ethyl group, a n-propyl group, an isopropyl group, a n-butyl group, etc.) is preferred. Among them, a hydrogen atom, a methyl group and an ethyl group are more preferred.

As the alkyl group for $E_1$ to $E_9$, a straight or branched $C_1$-$C_7$ alkyl group is preferred. Preferred examples of the alkyl group are a methyl group and an ethyl group. Examples of the halogen atoms are the same as above.

Preferred examples of the compound (IV), (V) or (VI) are as follows:

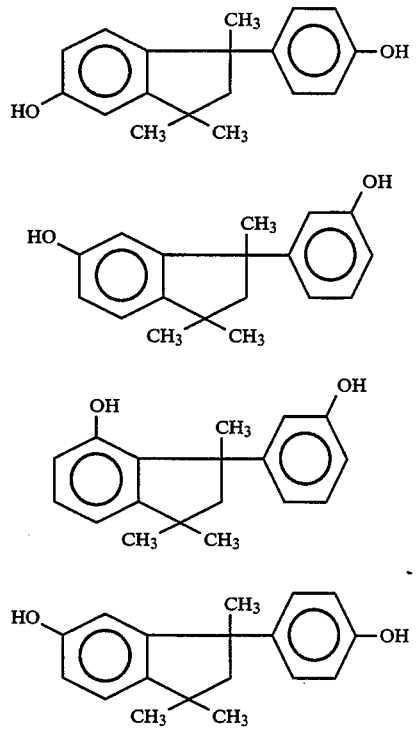

The compounds (VII) may be used alone or as a mixture thereof.

The compound (IV) may be easily prepared from m- or p-isopropenylphenol or its linear dimer by the method disclosed in U.S. Pat. No. 3,288,864 the disclosure of which is hereby incorporated by reference.

The compounds (V) and (VI) may be easily prepared by the methods disclosed in Japanese Patent Kokai Publication Nos. 64589/1979 and 101366/1974.

The phenol compound to be addition condensated with the carbonyl compound may contain other phenol compound insofar as the effects of the present invention are not deteriorated.

Examples of the other phenol compound are phenol, m-cresol, p-cresol, o-cresol, p-tert.-butylphenol, 2,5-xylenol, 3,5-xylenol, 2,3,5-trimethylphenol, 5-methyl-2-tert.-butylphenol, m-methoxyphenol, isoamylphenol, bisphenol A and the like.

A molar ratio of the compound (IV), (V) or (VI) to the other phenol compound is from 100:0 to 20:80.

Examples of the carbonyl compound are ketones (e.g. acetone, methyl ethyl ketone, methyl butyl ketone, methyl isobutyl ketone, methyl isopropyl ketone, etc.), and aldehydes (e.g. formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, glutaraldehyde, glyoxal, o-methylbenzaldehyde, p-methylbenzaldehyde, etc.). Among them, the aldehydes are preferred in view of a reaction rate. In particular, formaldehyde is preferred because of its easy availability.

These carbonyl compounds may be used independently or as a mixture of two or more of them.

The carbonyl compound is used in an amount of 0.2 to 3 moles, preferably 0.5 to 2 moles per one mole of the phenol compound.

As a catalyst, any of conventionally used organic acids, inorganic acid and divalent metal salts can be used. Specific examples of the acid catalyst are oxalic acid, acetic acid, hydrochloric acid, sulfuric acid, perchloric acid, p-toluenesulfonic acid, trichloroacetic acid, phosphoric acid, formic acid, zinc acetate, magnesium acetate, etc. Among them, oxalic acid and acetic acid are preferred. They may be used independently or as a mixture of two or more of them. An amount of the catalyst is from 0.1 to 50% by weight, preferably from 0.5 to 30% by weight based on the weight of the phenol compound.

The condensation may be carried out in the presence or absence of a solvent. When the solvent is used, preferred examples are toluene, xylene, ethylcellosolve acetate, n-propylalcohol, n-butylalcohol, isobutylalcohol, n-hexylalcohol, dipropyl ether, dibutyl ether, diglyme, n-heptane, n-octane, methyl isobutyl ketone and the like.

The addition condensation reaction of the compound (IV), (V) or (VI) and the carbonyl compound is carried out by a conventional method. The reaction is usually carried out at a temperature of 60° to 120° C. for 2 to 30 hours. When a solvent is used, the reaction is preferably carried out at a reflux temperature between 80° C. and 110° C.

Usually, the alkali-soluble resin has a weight average molecular weight (Mw) of 2000 to 50,000, preferably 3000 to 30,000, more preferably 3000 to 10,000 as measured by gel permeation chromatography (GPC).

As the radiation-sensitive compound, a quinone diazide compound is used. The quinone diazide compound is prepared by a conventional method, for example, by a condensation reaction of naphthoquinone diazide sulfonyl chloride or benzoquinone diazide sulfonyl chloride (e.g. naphthoquinone -(1,2)-diazide-(2)-5-sulfonyl chloride, naphthoquinone-(1,2)-diazide-(2)-4-sulfonyl chloride or benzoquinone-(1,2) -diazide-(2)-4-sulfonyl chloride) with a compound having a hydroxyl group in the presence of a weak alkali.

Examples of the compound having a hydroxyl group are hydroquinone, resorcinol, phloroglucin, 2,4-dihydroxybenzophenone, trihydroxybenzophenones (e.g. 2,3,4-trihydroxybenzophenone, 2,2',3-trihydroxybenzophenone, 2,2',4-trihydroxybenzophenone, 2,2',5-trihydroxybenzophenone, 2,3,3'-trihydroxybenzophenone, 2,3,4'-trihydroxybenzophenone, 2,3',4-trihydroxybenzophenone, 2,3',5-trihydroxybenzophenone, 2,4,4'-trihydroxybenzophenone, 2,4', 5-trihydroxybenzophenone, 2',3,4-trihydroxybenzophenone, 3,3',4-trihydroxybenzophenone, 3,4,4'-trihydroxybenzophenone, etc.), tetrahydroxybenzophenones (e.g. 2,3,3',4-tetrahydroxybenzophenone, 2,3,4,4'-tetrahydroxybenzophenone, 2,2',4,4'-tetrahydroxybenzophenone, 2,2',3,4- tetrahydroxybenzophenone, 2,2',3,4'-tetrahydroxybenzophenone, 2,2',5,5'-tetrahydroxybenzophenone, 2,3',4',5-tetrahydroxybenzophenone, 2,3',5,5'-tetrahydroxybenzophenone, etc.), pentahydroxybenzophenones (e.g. 2,2',3,4,4'-pentahydroxybenzophenone, 2,2',3,4,5'-pentahydroxybenzophenone, 2,2',3,3',4-pentahydroxybenzophenone, 2,3,3',4,5'-pentahydroxybenzophenone, etc.), hexahydroxybenzophenones (e.g. 2,3,3',4,4',5'-hexahydroxybenzophenone, 2,2',3,3',4,5'-hexahydroxybenzophenone, etc.), alkyl gallates, and hydrofravan compounds such as a compound of the formula:

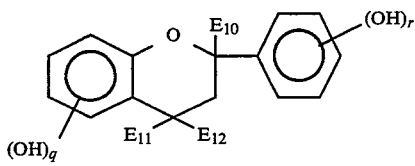

wherein q is a number of 0 to 4, r is a number of 1 to 5, provided that a sum of q and r is 2 or larger, $E_{10}$, $E_{11}$ and $E_{12}$ are respectively a hydrogen atom, an alkyl group, an alkenyl group, a cyclohexyl group or an aryl group.

The positive resist composition is prepared by mixing and dissolving the radiation-sensitive compound and the alkali-soluble resin in a solvent. A weight ratio of the alkali-soluble resin to the radiation-sensitive compound is preferably from 1:1 to 6:1.

Preferably, the used solvent evaporates at a suitable drying rate to give a uniform and smooth coating film. Examples of such solvent are ethylcellosolve acetate, methylcellosolve acetate, ethylcellosolve, methylcellosolve, propyleneglycol monomethyl ether acetate, butyl acetate, methyl isobutyl ketone, xylene, ethyl lactate, propyleneglycol monoethyl ether, etc. In case of ethylcellosolve acetate, the solvent is used in an amount of 30 to 80% by weight of the all solvent weight.

To the positive resist composition obtained by the foregoing method, small amounts of resins, dyes, etc. may be added if desired.

The resist composition of the present invention has improved sensitivity, heat resistance and the film thickness retention and is useful as a resist composition for KrF excimer laser.

PREFERRED EMBODIMENTS OF THE INVENTION

The present invention will be illustrated more in detail with the following Examples, but it is not limited to these Examples. In Examples, "parts" are by weight unless otherwise indicated.

EXAMPLE 1

In a 300 ml four-necked flask, a compound of the formula:

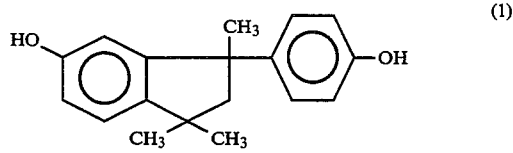

(p-OST Cyclic Dimer manufactured by Mitsui Toatsu) (53.6 g, 0.2 mol), ethylcellosolve acetate (50.4 g) and 5% oxalic acid (6.08 g, 0.003 mol) were charged and heated to 80° C. Then, to the mixture, 37% formalin (13.0 g, 0.16 mol) was dropwise added over 60 minutes while stirring, followed by stirring for 10 hours at 110° C.

Thereafter, the mixture was neutralized, washed with water and dehydrated to obtain a solution of a novolak resin in ethylcellosolve acetate.

The obtained novolak resin had a weight average molecular weight of 5500 (calculated as polystyrene).

In Examples, the weight average molecular weight was measured by GPC (manufactured by Toso).

The solution was reprecipitated with n-hexane, and a solid precipitate was dried under reduced pressure. A glass transition temperature ($T_g$) of the novolak resin was 242.5° C.

EXAMPLE 2

In a 500 ml four-necked flask equipped with a stirrer, a condenser, a dropping funnel and a thermometer, the compound (1) used in Example 1 (100 g, 0.37 mol), methyl isobutyl ketone (100 g), 5% oxalic acid (13.6 g, 0.0074 mol) and acetic acid (30 g, 0.5 mol) were charged and heated up to 80° C. To the mixture, 37% formalin (30.18 g, 0.37 mol) was dropwise added from the dropping funnel over about 60 minutes while stirring. Then, the mixture was stirred at 95° to 100° C. for 20 hours.

Thereafter, the mixture was neutralized, washed and dehydrated in the same manners as in Example 1 to obtain a solution of a novolak resin in methyl isobutyl ketone.

The resultant resin had a styrene-converted weight average molecular weight of 3975.

The solvent was evaporated off from the solution under reduced pressure to obtain a solid resin. A glass transition temperature ($T_g$) of the novolak resin was 239.4° C. The NMR chart of this resin is shown in FIG. 1, in which numeral 1 stands for a peak assigned to tetramethylsilane, 2 stands for a peak assigned to acetone, and 3 stands for a peak assigned to water.

EXAMPLES 3 and 4

In the same manner as in Example 2 but changing a molar ratio of formalin to the compound (1), a resin was prepared. An amount of formalin and properties of the resultant novolak resin are shown in Table 1.

TABLE 1

| Example No. | 37% Formalin Amount (g) | 37% Formalin Molar ratio*1) | Novolak resin Molecular weight | Novolak resin $T_g$ (°C.) |
|---|---|---|---|---|
| 3 | 36.2 | 1.2 | 4260 | 121.0 |
| 4 | 45.2 | 1.5 | 5150 | 101.7 |

Note: *1)A molar ratio of 37% formalin to the compound (1).

Synthesis Example 1

To a solution of m-isopropenylphenol (108.5 g, 0.80 mol) in toluene (540 ml), a boron trifluoride-ether complex ($BF_3$ content, 47%) (4.4 ml) was dropwise added from a dropping funnel over 10 minutes. After keeping the mixture at 75° to 80° C. for 4 hours, the mixture was cooled to 30° C. or lower, and water (200 ml) was added. After stirring, the mixture was separated, and a toluene layer was washed with a 1% aqueous solution of sodium bicarbonate till pH reached 7. Toluene was distilled off from the organic layer to obtain a viscous liquid containing a mixture (100 g) of a compound of the formula:

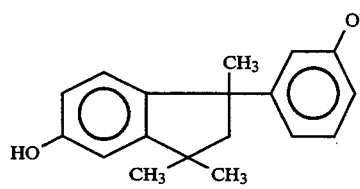

(2)

and a compound of the formula:

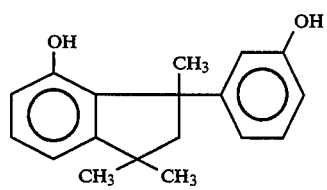

(3)

This liquid may be used as such or after purification, for example, by chromatography, as a raw material for the preparation of a novolak resin.

EXAMPLE 5

In the same manner as in Example 2 but using the mixture of the compounds (2) and (3) in place of the compound (1), a novolak resin was prepared, which had a molecular weight of 2960 and $T_g$ of 150° C.

EXAMPLE 6

In the same manner as in Example 1 except that the stirring at 110° C. was finished after 6 hours, a solution of a resin having a weight average molecular weight of 2420 in ethylcellosolve acetate was prepared. This solution was reprecipiated with n-hexane, and the precipitated solid was dried under reduced pressure. The product had Tg of 211.3° C.

EXAMPLES 7 to 12 and Comparative Examples 1 and 2

Each resin was dissolved in ethylcellosolve acetate (48parts) together with a quinone diazide compound in a composition shown in Table 2.

The resulting solution was filtered through a Teflon (trademark) filter of 0.2 μm in pore size to obtain a resist solution. The solution was then coated on a silicon wafer, which had been rinsed in a usual manner, by means of a spinner to form a resist film of 1.3 μm in thickness. The coated silicon wafer was baked for 60 seconds on a hot plate kept at 100° C. and exposed to light having a wavelength of 436 nm (g line) while varying the exposure time stepwise by means of a reduction projection exposure apparatus (NSR 1505 G 3C with NA=0.42 manufactured by Nicon). Thereafter, the silicon wafer was developed in a developer (SOPD (trade name) manufactured by Sumitomo Chemical Company, Limited) to obtain a positive pattern.

The remaining film thicknesses of the resist were plotted against the exposure time to calculate sensitivity. The film thickness retention was calculated from the remaining film thickness in the unexposed area. Also, the silicon wafer having a resist pattern was placed for 3 minutes on a direct hot plate set at various temperatures, and the heat resistance was evaluated by observing occurrence of thermal deformation of a line and space pattern of 3 μm by means of a scanning electron microscope. The results are shown in Table 2.

TABLE 2

| Example No. | Resist composition Novolak*1) resin (parts) | Resist composition Quinone diazide compound*3) (parts) | Resist properties Sensitivity*4) (msec) | Resist properties Film thickness retention (%) | Resist properties Heat resistance*4) (°C.) |
|---|---|---|---|---|---|
| 7 | Ex. 1 (15) | 4 | 170 | 98 | 160 |
| 8 | Ex. 2 (15) | 4 | 165 | 98 | 160 |
| 9 | Ex. 3 (15) | 4 | 165 | 98 | 155 |
| 10 | Ex. 4 (15) | 4 | 170 | 98 | 155 |

TABLE 2-continued

| Example No. | Resist composition | | Resist properties | | |
|---|---|---|---|---|---|
| | Novolak[*1)] resin (parts) | Quinone diazide compound[*3)] (parts) | Sensitivity[*4)] (msec) | Film thickness retention (%) | Heat resistance[*4)] (°C.) |
| 11 | Ex. 5 (15) | 4 | 175 | 97 | 140 |
| 12 | Ex. 6 (15) | 4 | 180 | 98 | 160 |
| C. 1 | A[*1)] (15) | 4 | 180 | 95 | 130 |
| C. 2 | B[*2)] (15) | 4 | 185 | 98 | 110 |

Note:
[*1)]Novolak A: A cresol mixture (the molar ratio of m-isomer to p-isomer = 7:3) was reacted with formalin (the molar ratio of the cresols to formalin = 1:0.8) were reacted in the presence of oxalic acid as a catalyst under reflux to obtain a novolak resin of 12,000 in a weight average molecular weight calculated as polystyrene.
[*2)] Novolak B: A cresol mixture (the molar ratio of m-isomer to p-isomer = 6:4) was reacted with formalin (the molar ratio of the cresols to formalin = 1:0.8) were reacted in the presence of oxalic acid as a catalyst under reflux to obtain a novolak resin of 7000 in a weight average molecular weight calculated as polystyrene.
[*3)]Quinone diazide compound: A condensation product of naphthoquinone-(1,2)-diazide-(2)-5-sulfonyl chloride and a compound of the formula:

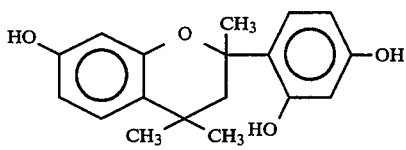

in a molar ratio of 2.4:1.
[*4)]A minimum exposure time (msec) at which the film thickness of the resist became zero.
[*5)]A temperature at which the line and space pattern of 3 μm started to thermally decompose.

EXAMPLE 13 and Comparative Example 3

The transmittance of light having a wavelength of 248 nm through the resin prepared in Example 6 or the resin used in Comparative Example 1 is shown in Table 3.

TABLE 3

| Example No. | Resin | Transmittance[*1)] |
|---|---|---|
| 13 | Example 6 | 40% |
| Comp. 3 | Comp. Ex. 1 | 20% |

Note: [*1)]The resin is dissolved in ethylcellosolve acetate and coated on a quartz wafer, and then the coated wafer was baked at 90° C. for 20 minutes. The transmittance is a value per 1 μm of the film thickness.

The novolak resin of the present invention has better heat resistance than the conventional phenol base novolak resin as a base resin of the resist composition used in the formation of the pattern during the semiconductor production, and is particularly useful as the base resin of the resist composition used in the formation of the pattern having a submicron order using the KrF excimer layer as a light source.

Further, the novolak resin of the present invention has better transmission in the deep UV range than the conventional novolak resin.

What is claimed is:
1. A positive resist composition comprising in admixture a quinone diazide compound prepared by a condensation reaction of naphthoquinone diazide sulfonyl chloride or benzoquinone diazidesulfonyl chloride with a compound having a hydroxyl group in the presence of a weak alkali, and an alkali-soluble novolak resin which is obtainable by a condensation reaction of an aldehyde and a compound of the formula:

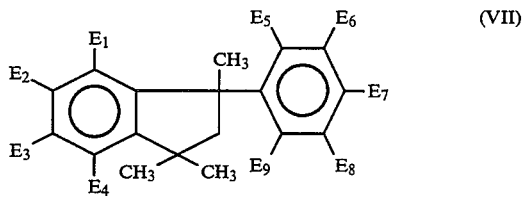

wherein $E_1$ to $E_9$ are the same or different and independently a hydrogen atom, an alkyl group, a halogen atom or a hydroxyl group, provided that at least one of $E_1$ to $E_9$ is a hydroxyl group and that at least two of $E_1$ to $E_9$ at the ortho- and para-positions to said at least one hydroxyl group are hydrogen atoms.

2. The positive resist composition according to claim 1, wherein the compound of formula (VII) is

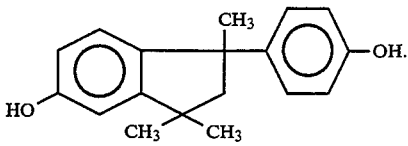

3. The positive resist composition according to claim 1, wherein the compound of formula (VII) is

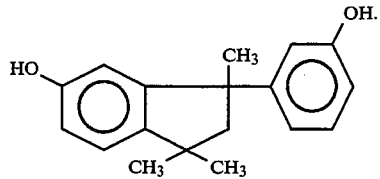

4. The positive resist composition according to claim 1, wherein the compound of formula (VII) is

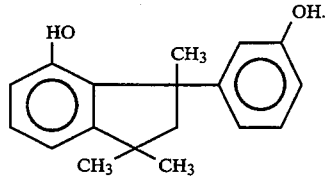

5. The positive resist composition according to claim 1, wherein the compound of formula (VII) is

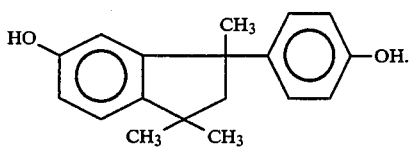

6. The positive resist composition according to claim 1, wherein a phenol compound selected from the group consisting of phenol, m-cresol, p-cresol, o-cresol, p-tert-butylphenol, 2,5-xylenol, 3,5-xylenol, 2,3,5-trimethylphenol, 5-methyl-2-tertbutylphenol, m-methoxyphenol, isoamylphenol and bisphenol A, is reacted in the condensation reaction of an aldehyde and a compound of formula (VII).

7. The positive resist composition according to claim 6, wherein the molar ratio of the compound of formula (VII) to the phenol compound is from 100:0 to 20:80.

8. The positive resist composition according to claim 1, wherein the aldehyde is selected from the group consisting of formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, glutaraldehyde, glyoxal, o-methylbenzaldehyde, and p-methylbenzaldehyde.

9. The positive resist composition according to claim 1, wherein the aldehyde is used in an amount of 0.2 to 3 moles per mole of the compound of formula (VII).

10. The positive resist composition according to claim 1, wherein the aldehyde is used in an amount of 0.5 to 3 moles per mole of the compound of formula (VII).

\* \* \* \* \*